United States Patent
Hiji et al.

(10) Patent No.: US 11,046,010 B2
(45) Date of Patent: Jun. 29, 2021

(54) THREE-DIMENSIONAL OBJECT DATA GENERATION APPARATUS, THREE-DIMENSIONAL OBJECT FORMING APPARATUS, AND NON-TRANSITORY COMPUTER READABLE MEDIUM

(71) Applicant: FUJIFILM BUSINESS INNOVATION CORP., Tokyo (JP)

(72) Inventors: Naoki Hiji, Kanagawa (JP); Torahiko Kanda, Kanagawa (JP); Yuki Yokoyama, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 153 days.

(21) Appl. No.: 16/374,776

(22) Filed: Apr. 4, 2019

(65) Prior Publication Data

US 2020/0139633 A1      May 7, 2020

(30) Foreign Application Priority Data

Nov. 2, 2018   (JP) .............................. JP2018-207513

(51) Int. Cl.
| | |
|---|---|
| *G06T 15/08* | (2011.01) |
| *G06T 19/00* | (2011.01) |
| *G06T 19/20* | (2011.01) |
| *B29C 64/393* | (2017.01) |
| *B29C 64/20* | (2017.01) |
| *B29C 64/153* | (2017.01) |
| *B33Y 50/02* | (2015.01) |
| *B33Y 10/00* | (2015.01) |

(52) U.S. Cl.
CPC .......... *B29C 64/393* (2017.08); *B29C 64/153* (2017.08); *B29C 64/20* (2017.08); *G06T 15/08* (2013.01); *B33Y 10/00* (2014.12); *B33Y 50/02* (2014.12)

(58) Field of Classification Search
None
See application file for complete search history.

(56) References Cited

U.S. PATENT DOCUMENTS

2017/0028649 A1    2/2017  Utsunomiya
2018/0036951 A1*   2/2018  Harayama ............ H04N 1/4052

FOREIGN PATENT DOCUMENTS

| JP | 2017-30177 A  | 2/2017 |
| JP | 2017-109427 A | 6/2017 |
| JP | 2018-1725 A   | 1/2018 |

* cited by examiner

*Primary Examiner* — Tize Ma
(74) *Attorney, Agent, or Firm* — Oliff PLC

(57) ABSTRACT

A three-dimensional object data generation apparatus includes an obtaining unit that obtains three-dimensional object data representing a three-dimensional object with plural voxels, for each of which a first attribute value is set, a setting unit that sets a three-dimensional threshold matrix in which thresholds are arranged in a three-dimensional space, an adjustment unit that adjusts a cycle of the three-dimensional threshold matrix in accordance with the first attribute values, and a calculation unit that calculates, for each of the plural voxels, a second attribute value using the first attribute value of the voxel and the three-dimensional threshold matrix whose cycle has been adjusted by the adjustment unit.

9 Claims, 19 Drawing Sheets

| 100 | 95 | 85 | 70 | 85 | 95 | 100 |
|---|---|---|---|---|---|---|
| 95 | 85 | 75 | 60 | 75 | 85 | 95 |
| 85 | 75 | 55 | 50 | 55 | 75 | 85 |
| 70 | 60 | 50 | 0 | 50 | 60 | 70 |
| 85 | 75 | 55 | 50 | 55 | 75 | 85 |
| 95 | 85 | 75 | 60 | 75 | 85 | 95 |
| 100 | 95 | 85 | 70 | 85 | 95 | 100 |

Z2

| 90 | 80 | 70 | 60 | 70 | 80 | 90 |
|---|---|---|---|---|---|---|
| 80 | 70 | 65 | 55 | 65 | 70 | 80 |
| 70 | 65 | 55 | 45 | 55 | 65 | 70 |
| 60 | 55 | 45 | 0 | 45 | 55 | 60 |
| 70 | 65 | 55 | 45 | 55 | 65 | 70 |
| 80 | 70 | 65 | 55 | 65 | 70 | 80 |
| 90 | 80 | 70 | 60 | 70 | 80 | 90 |

Z3

| 80 | 70 | 60 | 50 | 60 | 70 | 80 |
|---|---|---|---|---|---|---|
| 70 | 65 | 55 | 45 | 55 | 65 | 70 |
| 60 | 55 | 45 | 40 | 45 | 55 | 60 |
| 50 | 45 | 40 | 0 | 40 | 45 | 50 |
| 60 | 55 | 45 | 40 | 45 | 55 | 60 |
| 70 | 65 | 55 | 45 | 55 | 65 | 70 |
| 80 | 70 | 60 | 50 | 60 | 70 | 80 |

Z4

| 75 | 65 | 45 | 0 | 45 | 65 | 75 |
|---|---|---|---|---|---|---|
| 65 | 55 | 40 | 0 | 40 | 55 | 65 |
| 45 | 40 | 35 | 0 | 35 | 40 | 45 |
| 0 | 0 | 0 | 0 | 0 | 0 | 0 |
| 45 | 40 | 35 | 0 | 35 | 40 | 45 |
| 65 | 55 | 40 | 0 | 40 | 55 | 65 |
| 75 | 65 | 45 | 0 | 45 | 65 | 75 |

Z5

| 80 | 70 | 60 | 50 | 60 | 70 | 80 |
|---|---|---|---|---|---|---|
| 70 | 65 | 55 | 45 | 55 | 65 | 70 |
| 60 | 55 | 45 | 40 | 45 | 55 | 60 |
| 50 | 45 | 40 | 0 | 40 | 45 | 50 |
| 60 | 55 | 45 | 40 | 45 | 55 | 60 |
| 70 | 65 | 55 | 45 | 55 | 65 | 70 |
| 80 | 70 | 60 | 50 | 60 | 70 | 80 |

Z6

| 90 | 80 | 70 | 60 | 70 | 80 | 90 |
|---|---|---|---|---|---|---|
| 80 | 70 | 65 | 55 | 65 | 70 | 80 |
| 70 | 65 | 55 | 45 | 55 | 65 | 70 |
| 60 | 55 | 45 | 0 | 45 | 55 | 60 |
| 70 | 65 | 55 | 45 | 55 | 65 | 70 |
| 80 | 70 | 65 | 55 | 65 | 70 | 80 |
| 90 | 80 | 70 | 60 | 70 | 80 | 90 |

Z7

| 100 | 95 | 85 | 70 | 85 | 95 | 100 |
|---|---|---|---|---|---|---|
| 95 | 85 | 75 | 60 | 75 | 85 | 95 |
| 85 | 75 | 55 | 50 | 55 | 75 | 85 |
| 70 | 60 | 50 | 0 | 50 | 60 | 70 |
| 85 | 75 | 55 | 50 | 55 | 75 | 85 |
| 95 | 85 | 75 | 60 | 75 | 85 | 95 |
| 100 | 95 | 85 | 70 | 85 | 95 | 100 |

FIG. 10
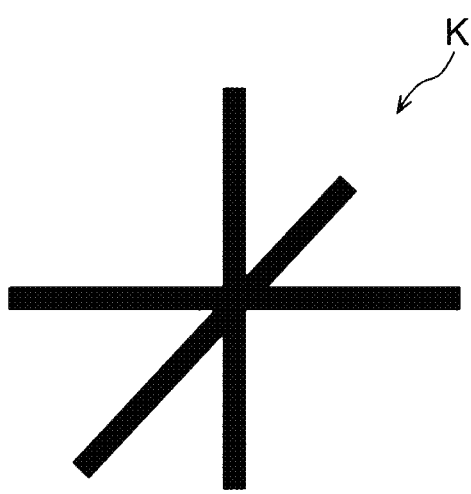
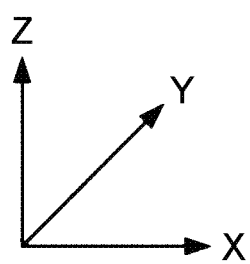

FIG. 12
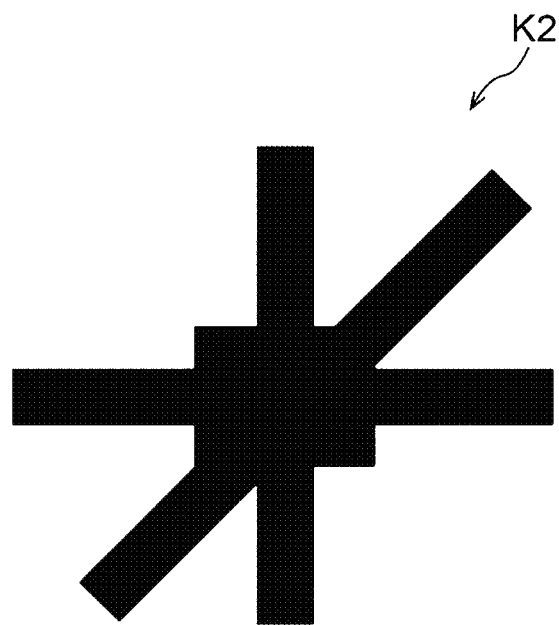
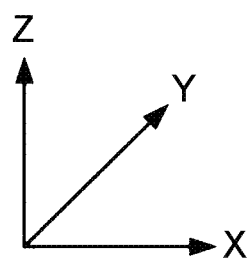

THREE-DIMENSIONAL OBJECT DATA GENERATION APPARATUS, THREE-DIMENSIONAL OBJECT FORMING APPARATUS, AND NON-TRANSITORY COMPUTER READABLE MEDIUM

CROSS-REFERENCE TO RELATED APPLICATIONS

This application is based on and claims priority under 35 USC 119 from Japanese Patent Application No. 2018-207513 filed Nov. 2, 2018.

BACKGROUND

(i) Technical Field

The present disclosure relates to a three-dimensional object data generation apparatus, a three-dimensional object forming apparatus, and a non-transitory computer readable medium.

(ii) Related Art

Japanese Unexamined Patent Application Publication No. 2017-109427 discloses a solid body forming apparatus including a dot forming unit that forms dots included in a solid body to be formed and a support member that supports the solid body and a control unit that controls the forming of the solid body and the support member including the dots. The control unit arranges the dots in a voxel group that represents the support member on the basis of an input value indicating a forming ratio of the dots in voxels included in the voxel group and a dither mask such that a support structure that supports the solid body is formed.

Japanese Unexamined Patent Application Publication No. 2017-30177 discloses a solid body forming apparatus that includes a head unit capable of discharging liquid, a curing unit that forms dots by curing the liquid discharged from the head unit, and a forming control unit that controls operation of the head unit such that a solid body is formed as a group of dots by representing a shape of the solid body to be formed with a voxel group and forming the dots in voxels, in the voxel group, determined by a determination unit as voxels in which the dots are to be formed. The determination unit determines the voxels in which the dots are to be formed in accordance with a forming index, which is a value according to a forming ratio of the dots in voxels in the voxel group inside the solid body and a result of comparison with a threshold included in the dither mask.

Japanese Unexamined Patent Application Publication No. 2018-1725 discloses a three-dimensional data generation apparatus including a measurement result reception unit that receives a result of measurement of a shape of a first object output from an output apparatus using first three-dimensional data specifying the shape of the first object, a correction data calculation unit that calculates correction data on the basis of an error from the shape specified by the first three-dimensional data corresponding to the result of measurement received by the measurement result reception unit, and a data correction unit that corrects second three-dimensional data specifying a shape of a second object using the correction data calculated by the correction data calculation unit.

SUMMARY

If a cycle of a three-dimensional threshold matrix is fixed when an attribute value of each of voxels representing a three-dimensional object is calculated on the basis of a result of comparison between an attribute value set for the voxel and a threshold in the three-dimensional threshold matrix, it might be difficult to finely adjust physical property values achieved by the three-dimensional object.

Aspects of non-limiting embodiments of the present disclosure relate to a three-dimensional object data generation apparatus, a three-dimensional object forming apparatus, and a non-transitory computer readable medium capable of finely adjust physical property values achieved by a three-dimensional object compared to when a cycle of a three-dimensional threshold matrix is fixed regardless of attribute values of voxels.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of the present disclosure may not overcome any of the disadvantages described above.

According to an aspect of the present disclosure, there is provided a three-dimensional object data generation apparatus including an obtaining unit that obtains three-dimensional object data representing a three-dimensional object with a plurality of voxels, for each of which a first attribute value is set, a setting unit that sets a three-dimensional threshold matrix in which thresholds are arranged in a three-dimensional space, an adjustment unit that adjusts a cycle of the three-dimensional threshold matrix in accordance with the first attribute values, and a calculation unit that calculates, for each of the plurality of voxels, a second attribute value using the first attribute value of the voxel and the three-dimensional threshold matrix whose cycle has been adjusted by the adjustment unit.

BRIEF DESCRIPTION OF THE DRAWINGS

An exemplary embodiment of the present disclosure will be described in detail based on the following figures, wherein:

FIG. 8 is a diagram illustrating an example of threshold tables included in the three-dimensional threshold matrix;

FIG. 10 is a diagram illustrating an example of a basic shape;

FIG. 12 is a diagram illustrating another example of the basic shape;

DETAILED DESCRIPTION

An exemplary embodiment of the present disclosure will be described hereinafter with reference to the drawings.

Figure 1:
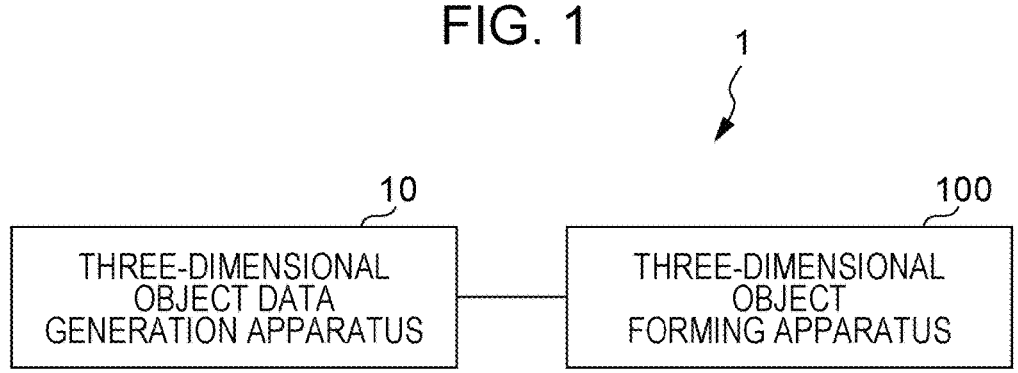
FIG. 1 is a diagram illustrating the configuration of a three-dimensional object forming system.

FIG. 1 is a diagram illustrating the configuration of a three-dimensional object forming system 1 according to the present exemplary embodiment. As illustrated in FIG. 1, the three-dimensional object forming system 1 includes a three-dimensional object data generation apparatus 10 and a three-dimensional object forming apparatus 100.

Figure 2:
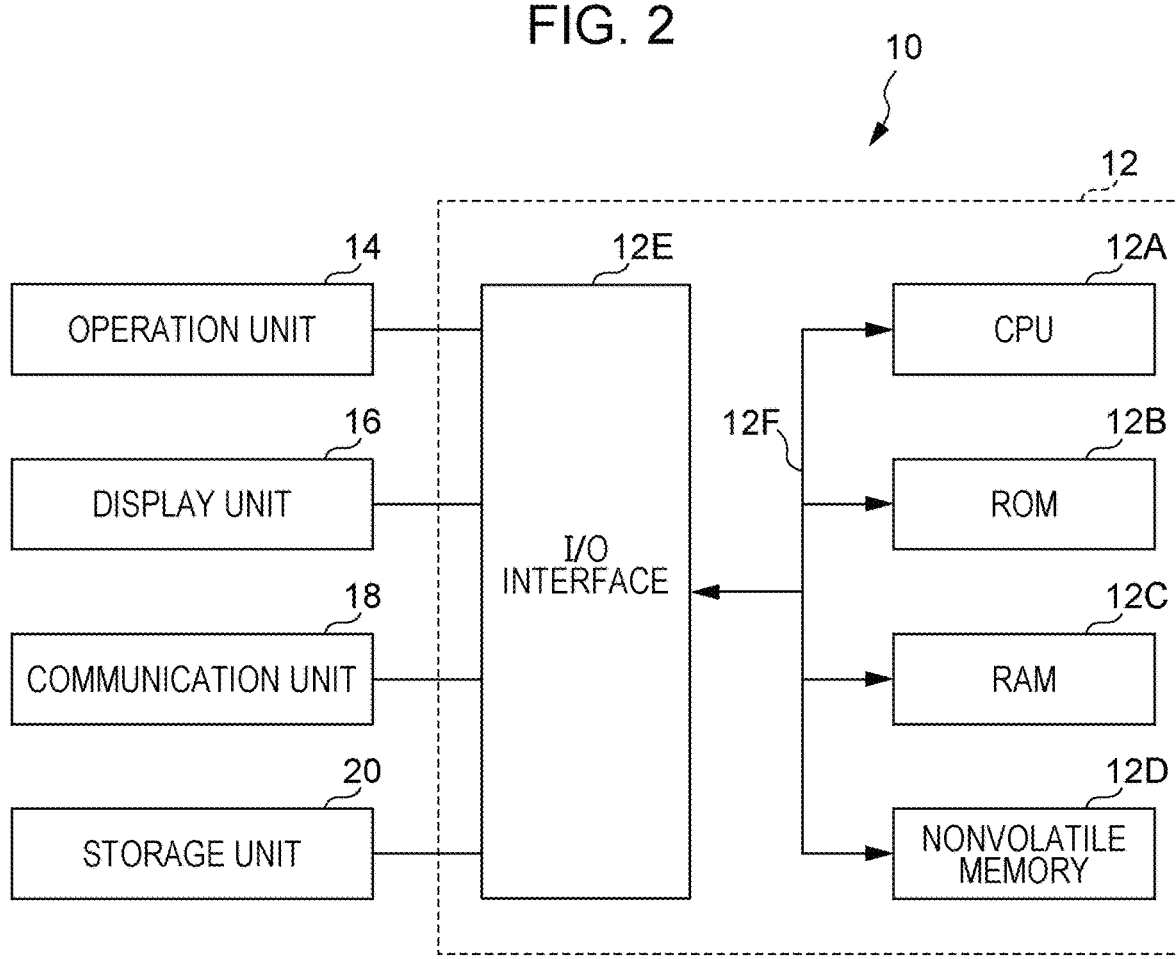
FIG. 2 is a diagram illustrating the configuration of a three-dimensional object data generation apparatus.

Next, the configuration of the three-dimensional object data generation apparatus 10 according to the present exemplary embodiment will be described with reference to FIG. 2.

The three-dimensional object data generation apparatus 10 is a personal computer, for example, and includes a controller 12. The controller 12 includes a central processing unit (CPU) 12A, a read-only memory (ROM) 12B, a random-access memory (RAM) 12C, a nonvolatile memory 12D, and an input/output (I/O) interface 12E. The CPU 12A, the ROM 12B, the RAM 12C, the nonvolatile memory 12D, and the I/O interface 12E are connected to one another through a bus 12F.

An operation unit 14, a display unit 16, a communication unit 18, and a storage unit 20 are connected to the I/O interface 12E.

The operation unit 14 includes, for example, a mouse and a keyboard.

The display unit 16 is, for example, a liquid crystal display.

The communication unit 18 is an interface for communicating data with external apparatuses such as the three-dimensional object forming apparatus 100.

The storage unit 20 is a nonvolatile storage device such as a hard disk and stores a program for generating three-dimensional object data, which will be described later, three-dimensional object data (voxel data), and a three-dimensional threshold matrix, which will be described later, and the like. The CPU 12A reads the program for generating three-dimensional object data stored in the storage unit 20 and executes the program.

Next, the functional configuration of the CPU 12A will be described.

Figure 3:
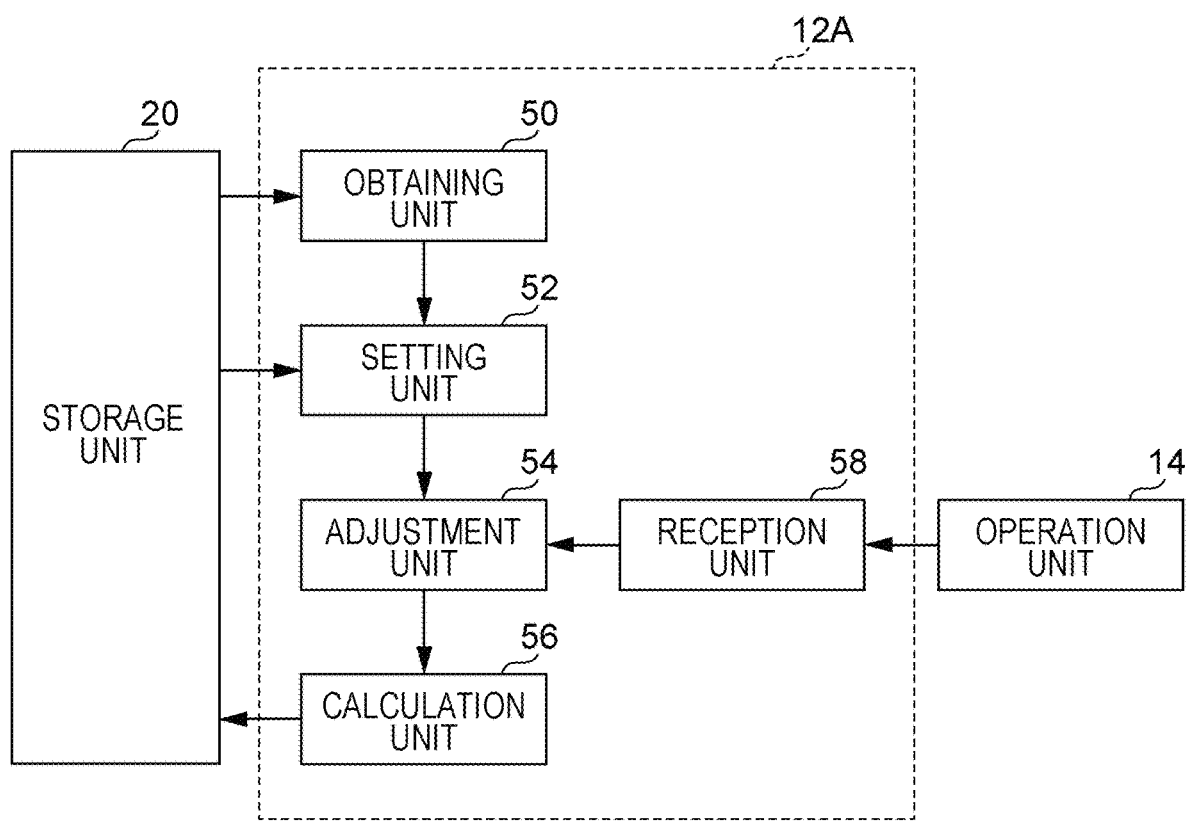
FIG. 3 is a block diagram illustrating the functional configuration of the three-dimensional object data generation apparatus.

As illustrated in FIG. 3, the CPU 12A includes an obtaining unit 50, a setting unit 52, an adjustment unit 54, a calculation unit 56, and a reception unit 58 in terms of functions.

The obtaining unit 50 represents a three-dimensional object with a plurality of voxels and obtains three-dimensional object data in which a first attribute value is set for each of a plurality of voxels by reading the three-dimensional object data from the storage unit 20.

The setting unit 52 sets a three-dimensional threshold matrix, in which thresholds are arranged in a three-dimensional space, by reading the three-dimensional threshold matrix from the storage unit 20.

The adjustment unit 54 adjusts a cycle of the three-dimensional threshold matrix set by the setting unit 52 in accordance with the first attribute values. More specifically, the adjustment unit 54 adjusts the cycle of the three-dimensional threshold matrix using adjustment coefficients for setting degrees of adjustment of the cycle of the three-dimensional threshold matrix.

The calculation unit 56 calculates a second attribute value for each of the plurality of voxels using the first attribute value of the voxel and the three-dimensional threshold matrix whose cycle has been adjusted by the adjustment unit 54 and stores the second attribute value in the storage unit 20.

The reception unit 58 receives adjustment coefficients specified by a user by operating the storage unit 14, details of which will be described later.

If the reception unit 58 receives adjustment coefficients, the adjustment unit 54 adjusts the cycle of the three-dimensional threshold matrix using the adjustment coefficients in accordance with the first attribute values.

A case will be described in the present exemplary embodiment where an intensity value indicating the intensity of each voxel is set for the voxel as a first attribute value and whether to form the voxel is calculated as a second attribute value.

Figure 4:
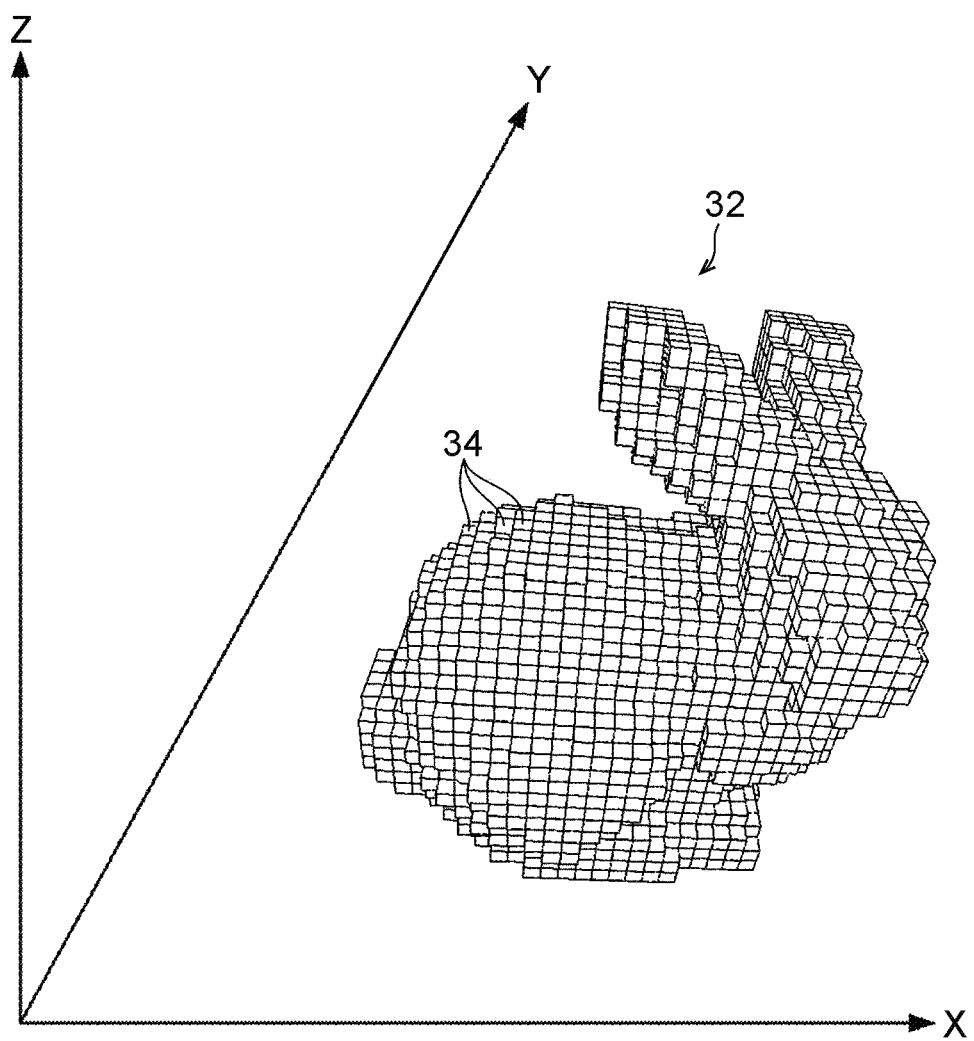
FIG. 4 is a diagram illustrating an example of a three-dimensional object represented by voxel data.

FIG. 4 illustrates a three-dimensional object 32 represented by three-dimensional object data (voxel data), which is a group of voxels. As illustrated in FIG. 4, the three-dimensional object 32 includes a plurality of voxels 34.

The voxels 34 are basic elements of the three-dimensional object 32. The voxels 34 may be rectangular parallelepipeds, for example, but may be spheres or cylinders, instead. A desired three-dimensional object is represented by stacking the voxels 34 on one another.

As a method for forming a three-dimensional object, for example, fused deposition modeling (FDM), in which thermoplastic resin is plasticized and stacked to form a three-dimensional object, or selective laser sintering (SLS), in which a laser beam is radiated onto a powdery metal material to form a three-dimensional object through sintering, is used, but another method may be used, instead. In the present exemplary embodiment, a case where a three-dimensional object is formed using FDM will be described.

Next, a three-dimensional object forming apparatus that forms a three-dimensional object using three-dimensional object data generated by the three-dimensional object data generation apparatus 10 will be described.

Figure 5:
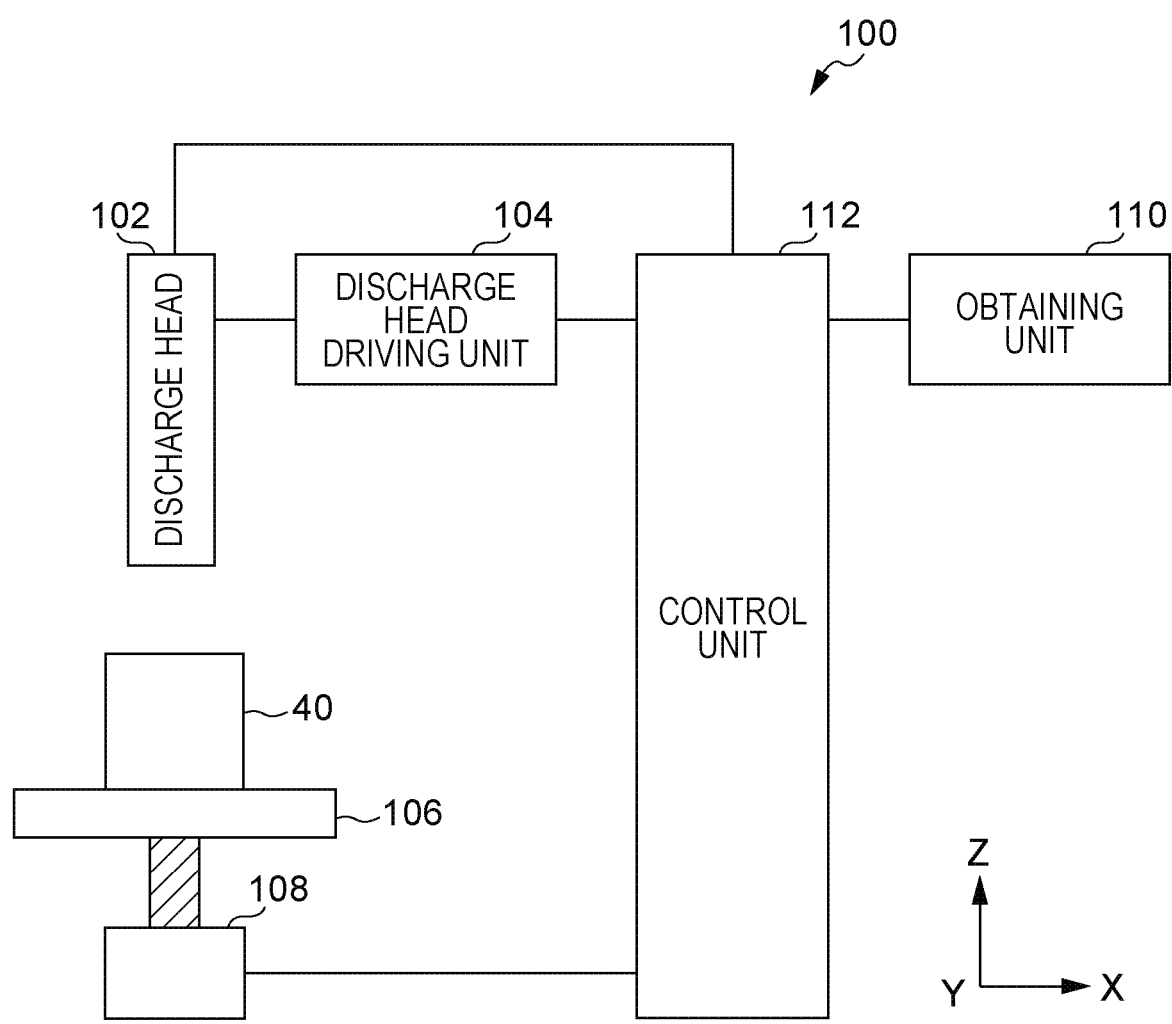
FIG. 5 is a diagram illustrating the configuration of a three-dimensional object forming apparatus.

FIG. 5 illustrates the configuration of the three-dimensional object forming apparatus 100 according to the present exemplary embodiment. The three-dimensional object forming apparatus 100 forms a three-dimensional object using FDM.

As illustrated in FIG. 5, the three-dimensional object forming apparatus 100 includes a discharge head 102, a discharge head driving unit 104, a stand 106, a stand driving unit 108, an obtaining unit 110, and a control unit 112. The discharge head 102, the discharge head driving unit 104, the stand 106, and the stand driving unit 108 are an example of a forming unit.

The discharge head 102 includes an object material discharge head that discharges an object material for forming a three-dimensional object 40 and a support material discharge head that discharges a support material. The support material is used to support overhangs (also referred to as "projections") of the three-dimensional object 40 and removed after the three-dimensional object 40 is formed.

The discharge head 102 is driven by the discharge head driving unit 104 and moves on an X-Y plane in two dimensions. The object material discharge head may include a plurality of discharge heads corresponding to object materials of a plurality of attributes (e.g., colors).

The stand 106 is driven by the stand driving unit 108 and moves along a Z axis.

The obtaining unit 110 obtains three-dimensional object data and support material data generated by the three-dimensional object data generation apparatus 10.

The control unit 112 drives the discharge head driving unit 104 to move the discharge head 102 in two dimensions and controls the discharge of the object material and the support material performed by the discharge head 102 such that the object material is discharged in accordance with the object material route data obtained by the obtaining unit 110 and the support material is discharged in accordance with the support material route data obtained by the obtaining unit 110.

Each time a layer has been formed, the control unit 112 drives the stand driving unit 108 to lower the stand 106 by a predetermined layer interval. As a result, a three-dimensional object based on three-dimensional object data is formed.

Figure 6:
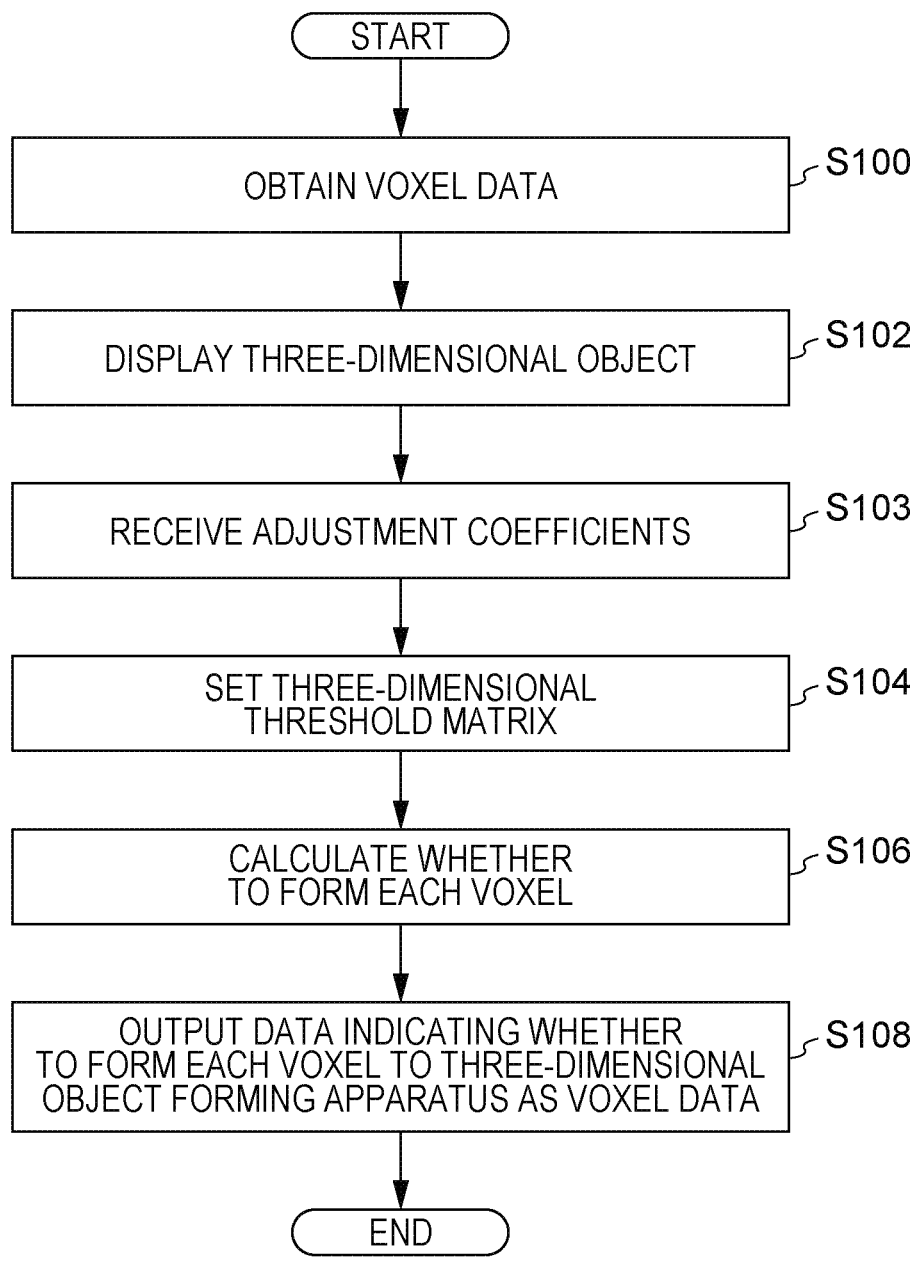
FIG. 6 is a flowchart illustrating a process achieved by a program for generating three-dimensional object data.

Next, the operation of the three-dimensional object data generation apparatus 10 according to the present exemplary embodiment will be described with reference to FIG. 6. A generation process illustrated in FIG. 6 is performed by causing the CPU 12A to execute a program for generating three-dimensional object data. The generation process illustrated in FIG. 6 is performed, for example, when the user has requested execution of the program. In the present exemplary embodiment, description of a process for generating support material data and support material route data is omitted.

In step S100, voxel data corresponding to a three-dimensional object to be formed is read, for example, from the storage unit 20. Alternatively, voxel data may be obtained from an external apparatus using the communication unit 18.

In step S102, three-dimensional object display data is generated from the voxel data obtained in step S100 and displayed on the display unit 16.

In step S103, the display unit 16 displays a screen for receiving adjustment coefficients, which will be described later, and receives adjustment coefficients input by the user. The adjustment coefficients are set for three axes, namely X, Y, and Z axes, which are perpendicular to one another. The user may input an adjustment coefficient for each of the X, Y, and Z axes, or a single input adjustment coefficient may be automatically set for all the axes.

In step S104, a three-dimensional threshold matrix used to calculate whether to form each voxel is set. In the three-dimensional threshold matrix, thresholds are arranged in a three-dimensional space in accordance with a predetermined basic shape.

Figure 7:
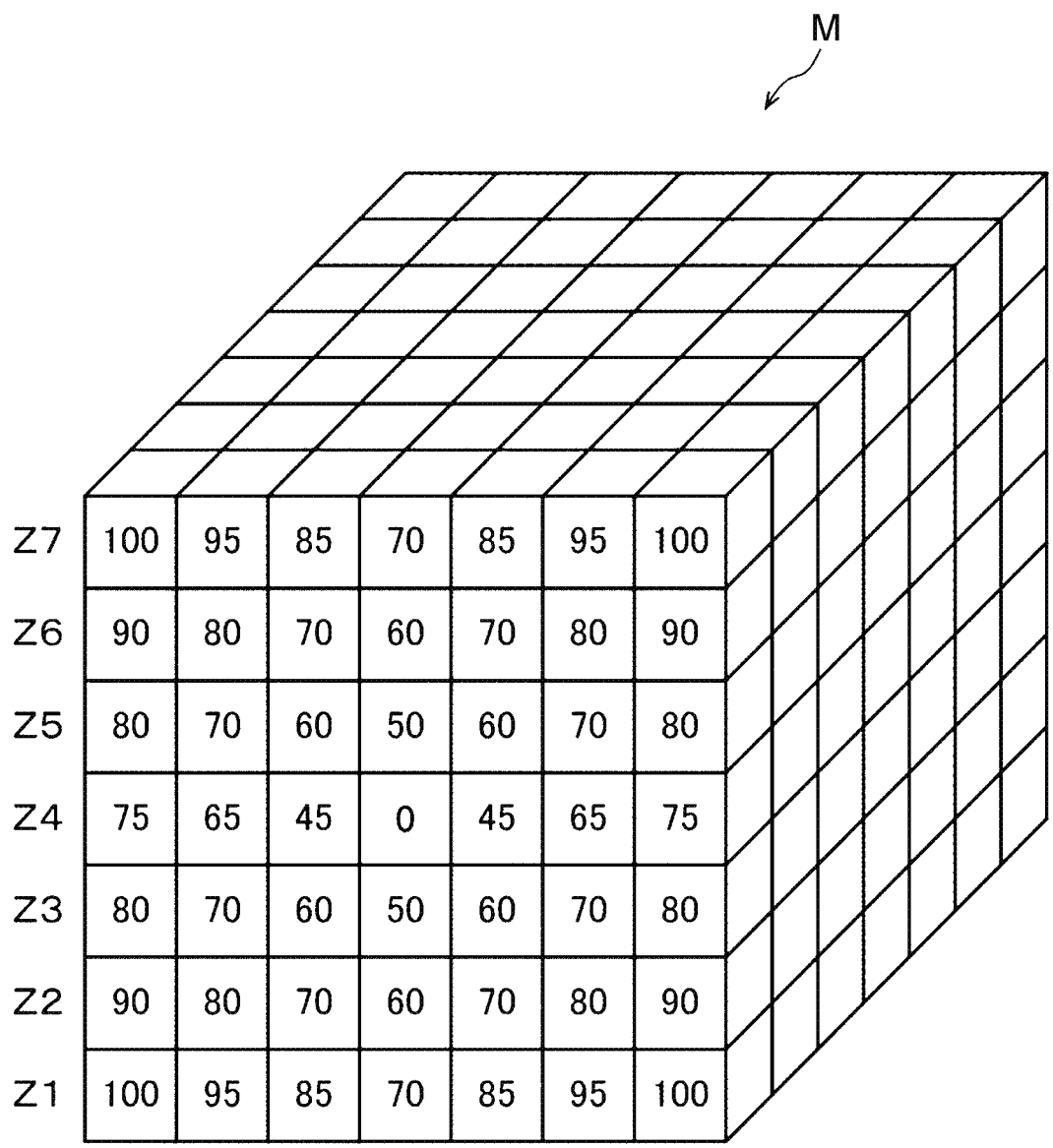
FIG. 7 is a diagram illustrating an example of a three-dimensional threshold matrix.

FIG. 7 illustrates a three-dimensional threshold matrix M as an example. As illustrated in FIG. 7, the three-dimensional threshold matrix M includes seven layers of threshold tables Z1 to Z7.

FIG. 8 illustrates an example of the threshold tables Z1 to Z7. As described later, when whether to form each voxel is calculated, the same process as so-called "halftone" is performed on voxel data in layers of the threshold tables Z1 to Z7 with the threshold tables Z1 to Z7 set as dither matrices. That is, each threshold in the threshold tables Z1 to Z7 and an intensity value of a corresponding voxel are compared with each other. If the intensity value is equal to or larger than threshold, the voxel is to be formed, and if the intensity value is smaller than the threshold, the voxel is not to be formed. It is assumed in the present exemplary embodiment that a value that can be taken by an intensity value is equal to or larger than 0. If the threshold is 0, a voxel corresponding to the threshold will be invariably formed. Parts where thresholds are 0, therefore, correspond to the basic shape.

Figure 9:
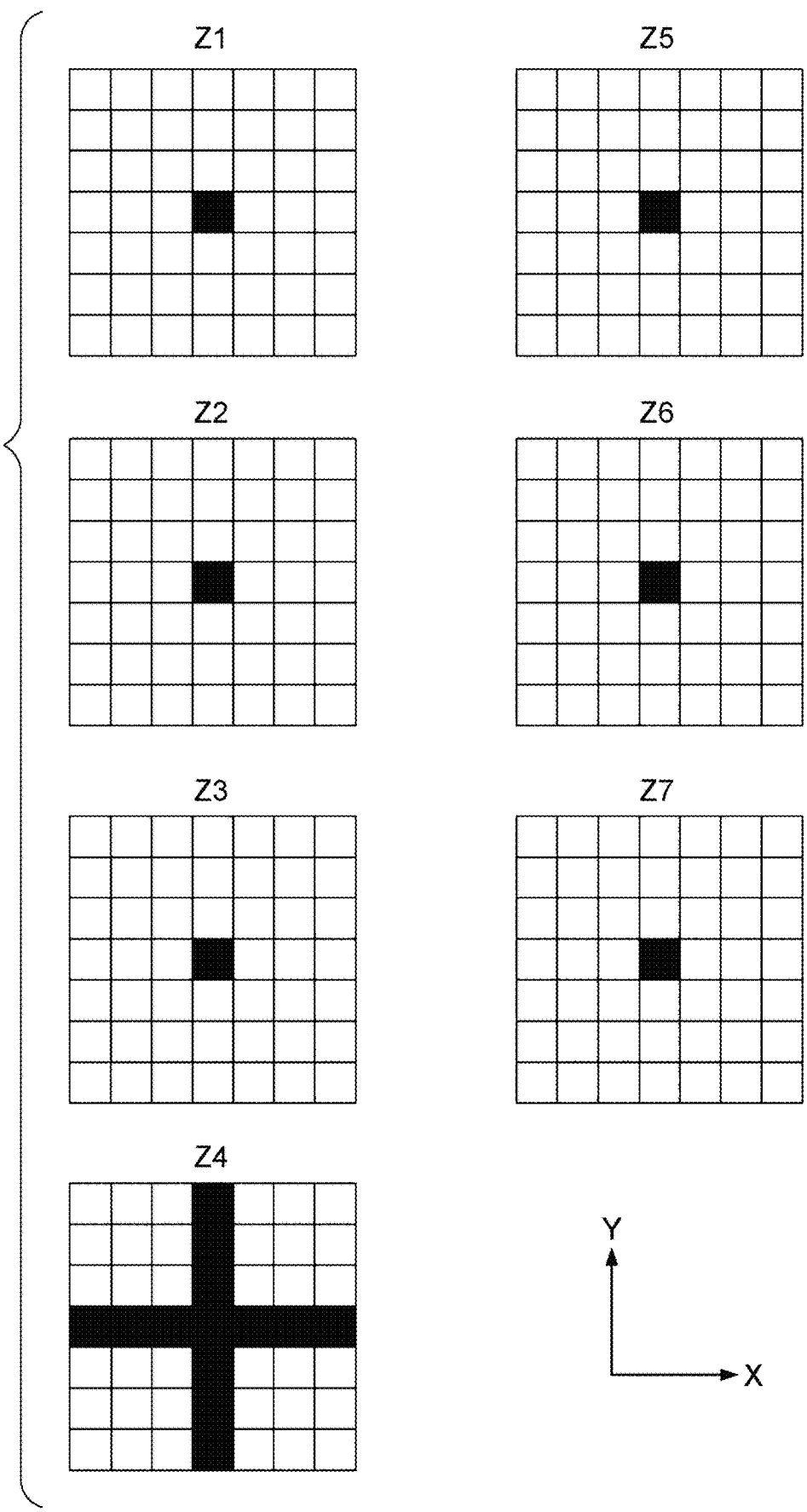
FIG. 9 is a diagram illustrating presence or absence of discharging of a forming material.

In the example illustrated in FIG. 8, a threshold of 0 is set at the center of every layer, and in the fourth threshold table Z4, which is a central layer in a Z-axis direction, a threshold of 0 is set on an XY plane in a shape of a cross. That is, thresholds at positions corresponding to the basic shape are set to a minimum value of a possible range of thresholds. If intensity values of voxels are all 0 in the three-dimensional threshold matrix M, therefore, a forming material is discharged at positions indicated by solid squares illustrated in FIG. 9. As a result, the basic shape of the three-dimensional threshold matrix M becomes a basic shape K illustrated in FIG. 10.

Figure 11:
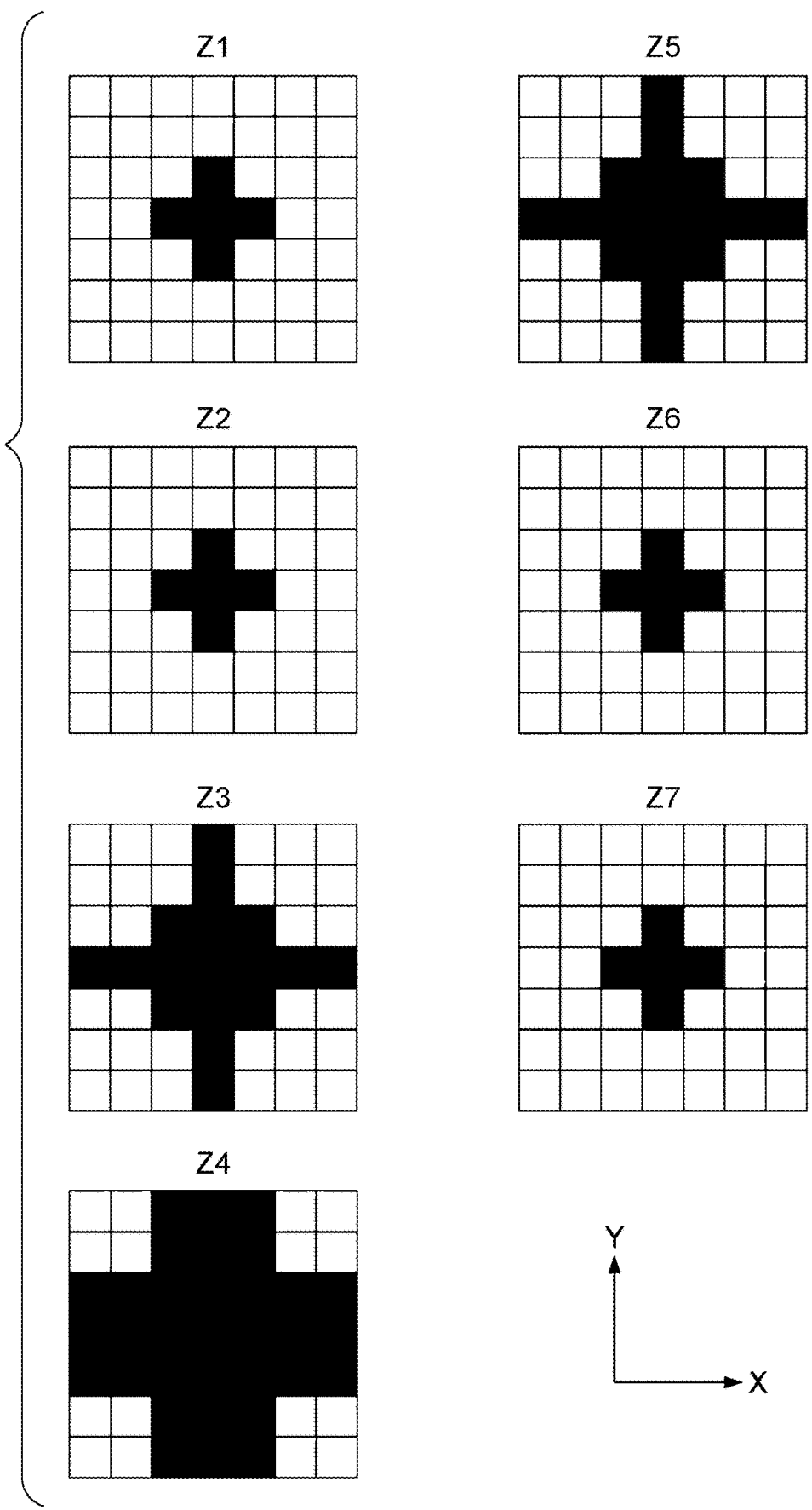
FIG. 11 is a diagram illustrating presence or absence of discharging of a forming material.

As illustrated in FIG. 8, thresholds in the threshold tables Z1 to Z7 other than those at the positions corresponding to the basic shape are all 35 or larger. If the intensity values of the voxels are all smaller than 35, therefore, the basic shape K illustrated in FIG. 10 is obtained. If the intensity values of the voxels are all 50, on the other hand, a forming material is discharged at positions indicated by solid squares illustrated in FIG. 11. As a result, as illustrated in FIG. 12, the basis shape of the three-dimensional threshold matrix M becomes a basic shape K2, which is thicker than the basic shape K illustrated in FIG. 10.

As illustrated in FIG. 8, the thresholds set in the threshold tables Z1 to Z7 other than those at the positions corresponding to the basic shape are larger in the periphery. This means that the thresholds set in the three-dimensional threshold matrix M are smaller at the center of the three-dimensional space indicated by the three-dimensional threshold matrix M and larger in the periphery. That is, because of the thresholds set in the three-dimensional threshold matrix M, the percentage of voxels to be formed is lower in the periphery of the three-dimensional space indicated by the three-dimensional threshold matrix M. In other words, the thresholds are set such that intensity becomes higher at the center of the three-dimensional space indicated by the three-dimensional threshold matrix M. As the three-dimensional threshold matrix M becomes smaller, the basic shape becomes smaller and a resultant three-dimensional object becomes denser and harder. As the three-dimensional threshold matrix M becomes larger, on the other hand, the basic shape becomes larger and a resultant three-dimensional object becomes thinner and softer. If the user desires to make a certain part hard, therefore, the user may set a small three-dimensional threshold matrix, and if the user desires to make a certain part soft, the user may set a large three-dimensional threshold matrix.

In the present exemplary embodiment, the storage unit 20 stores various three-dimensional threshold matrices corresponding to various basic shapes. The user operates the storage unit 14 to select a desired basic shape, that is, a desired three-dimensional threshold matrix. The number of three-dimensional threshold matrices to be selected need not be one, and a plurality of three-dimensional threshold matrices may be selected for each part of a three-dimensional object, instead.

In step S106, whether to form each of the plurality of voxels indicated by the voxel data is calculated on the basis of the intensity value set for the voxel, the three-dimensional threshold matrix set in step S104, and the adjustment coefficients received in step S103. More specifically, as described above, the same process as so-called "halftone" is performed on the voxel data in layers corresponding to the threshold tables Z1 to Z7 with the threshold tables Z1 to Z7 set as dither matrices. That is, each threshold in the threshold tables Z1 to Z7 and the intensity value of the voxel at a corresponding position are compared with each other. If the intensity value is equal to or larger than the threshold, the voxel is to be formed, and if the intensity value is smaller than the threshold, the voxel is not to be formed.

Whether each voxel is to be formed is calculated using the following expressions, where the first attribute value of the voxel is denoted by $V1(i, j, k)$, the corresponding threshold in the three-dimensional threshold matrix is denoted by $Mt(l, m, n)$, and the second attribute value is denoted by $V2(i, j, k)$.

$$V2(i,j,k)=V\max P, V1(i,j,k)<Mt(l,m,n) \quad (1)$$

$$V2(i,j,k)=V\max M, V1(i,j,k)\geq Mt(l,m,n) \quad (2)$$

Here, i denotes a coordinate value of the X axis, j denotes a coordinate value of the Y axis, and k denotes a coordinate value of the Z axis. l, m, and n denote X, Y, and Z coordinates of the threshold in the three-dimensional coordinate matrix and are expressed as follows.

$$l=MOD(Ax\times i,Mx) \quad (3)$$

$$m=MOD(Ay\times j,My) \quad (4)$$

$$n=MOD(Az\times k,Mz) \quad (5)$$

MOD(a, b) denotes a residue at a time when a has been divided by b. Therefore, l denotes a residue at a time when $Ax\times i$ has been divided by Mx. Similarly, m denotes a residue at a time when $Ay\times j$ has been divided by My, and n denotes a residue at a time when $Az\times k$ has been divided by Mz. Mx denotes the size of the three-dimensional threshold matrix in an X-axis direction, that is, the number of thresholds in the X-axis direction. Similarly, My denotes the size of the three-dimensional threshold matrix in a Y-axis direction, that is, the number of thresholds in the Y-axis direction, and Mz denotes the size of the three-dimensional threshold matrix in the Z-axis direction, that is, the number of thresholds in the Z-axis direction.

Ax, Ay, and Ax are expressed as follows.

$$Ax=Ax0\times V1(i,j,k)/V\max P+1 \quad (6)$$

$$Ay=Ay0\times V1(i,j,k)/V\max P+1 \quad (7)$$

$$Az=Az0\times V1(i,j,k)/V\max P+1 \quad (8)$$

Ax0 is the adjustment coefficient for the X axis, Ay0 is the adjustment coefficient for the Y axis, and Az0 is the adjustment coefficient for the Z axis. $0\leq Ax0\leq Bx$, $0\leq Ay0\leq By$, and $0\leq Az0\leq Bz$. Bx denotes a maximum value of the adjustment coefficient Ax. Similarly, By and Bz denote maximum values of the adjustment coefficients Ay and Az, respectively. Although a case where Bx=By=Bz=1 will be described in the present exemplary embodiment as an example, the maximum values of the adjustment coefficients are not limited to 1. If all the adjustment coefficients are 0, that is, if Ax0=Ay0=Az0=0, the cycle of the three-dimensional threshold matrix is not adjusted. As an adjustment coefficient becomes larger from 0, a degree of adjustment becomes larger. In order to increase a maximum value of the degree of adjustment, therefore, Bx, By, or Bz is increased.

VmaxM is a value obtained by adding a minus sign "−" to a maximum value of $V1(i, j, k)$. In the present exemplary embodiment, $V1(i, j, k)$ is expressed in 8 bits, for example, and can take a value of 0 to 255. VmaxM, therefore, is −255. VmaxP is a value obtained by adding a plus sign "+" to a maximum value of $V1(i, j, k)$. VmaxP, therefore, is +255. VmaxM indicates that a voxel is not to be formed, and VmaxP indicates that a voxel is to be formed.

If the first attribute value $V1(i, j, k)$ is smaller than the threshold $Mt(l, m, n)$, the second attribute value $V2(i, j, k)$ becomes VmaxM, and a voxel is not to be formed. If the first attribute value $V1(i, j, k)$ is equal to or larger than the threshold $Mt(l, m, n)$, the second attribute value $V2(i, j, k)$ becomes VmaxP, and a voxel is to be formed.

Figure 13:
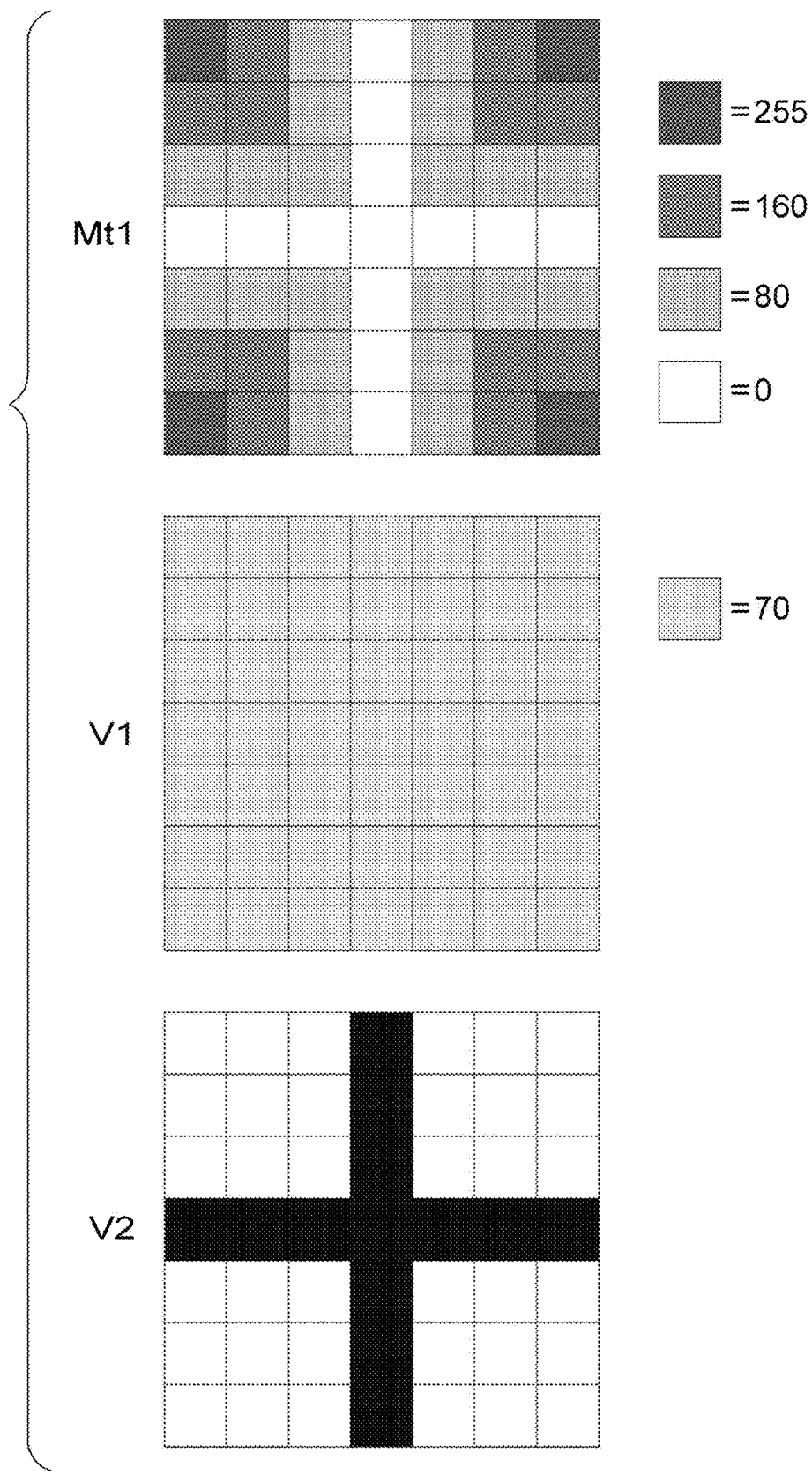
FIG. 13 is a diagram illustrating an example of a threshold matrix, first attribute values, and second attribute values.

As illustrated in FIG. 13, for example, a case where a threshold matrix Mt1 and the first attribute values V1 of voxels are compared with each other will be described. Here, the adjustment coefficients are Ax0=Ay0=Az0=0, that is, a cycle of the three-dimensional threshold matrix Mt1 is not adjusted.

The three-dimensional threshold matrix Mt1 illustrated in FIG. 13 includes various values such that the thresholds gradually change from the threshold of 0, which corresponds to the basic shape. More specifically, the three-dimensional threshold matrix Mt1 includes four thresholds of 0, 80, 160, and 255. The larger the distance from the threshold of 0, which corresponds to the basic shape, the larger the threshold. It is assumed here that the first attribute values V1 of the voxels are uniformly 70. In this case, as illustrated in FIG. 13, the second attribute values V2 of central voxels in the X-axis direction and the Y-axis directions indicate that a voxel is to be formed, thereby forming a shape of a cross.

Figure 14:
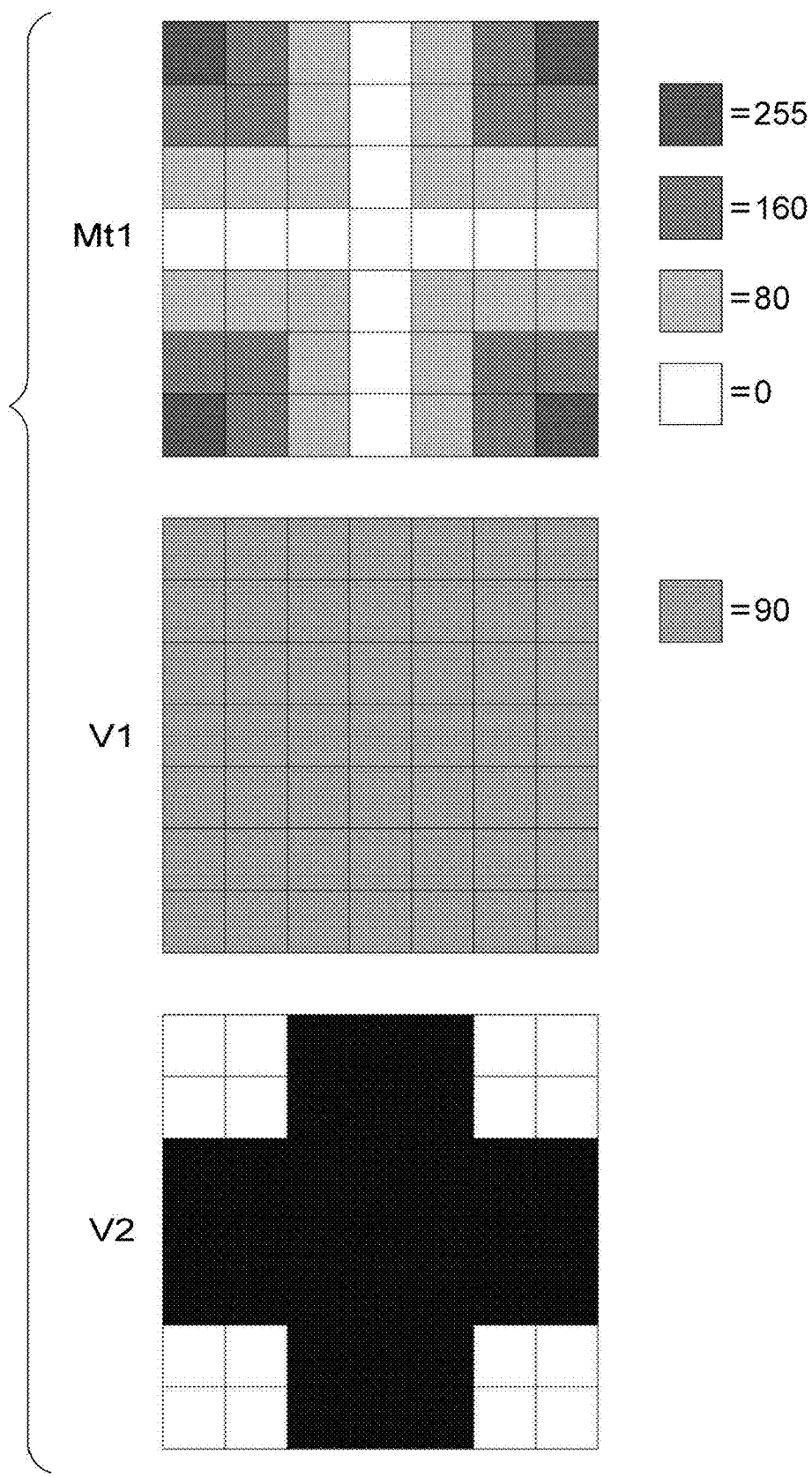
FIG. 14 is a diagram illustrating another example of the threshold matrix, the first attribute values, and the second attribute values.

It is also assumed that the first attribute values V1 of the voxels are uniformly 90 as illustrated in FIG. 14. In this case, the second attribute values V2 of three central voxels in the X-axis direction and the Y-axis direction indicate that a voxel is to be formed, thereby forming a shape of a cross thicker than that illustrated in FIG. 13.

Figure 15:
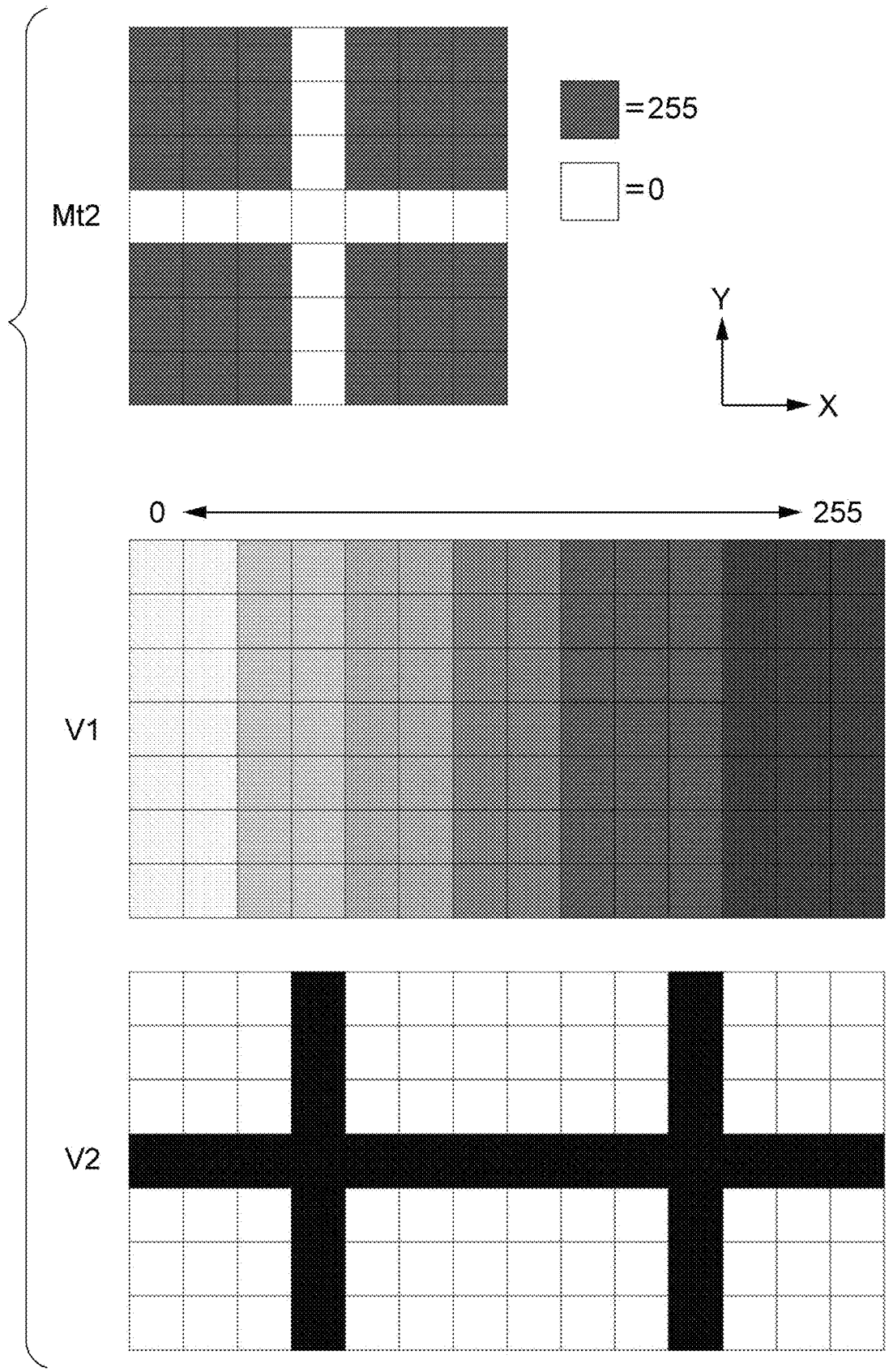
FIG. 15 is a diagram illustrating another example of the threshold matrix, the first attribute values, and the second attribute values.

Next, as illustrated in FIG. 15, a case will be described where a threshold matrix Mt2 in which two different thresholds, namely a first threshold of 0 corresponding to the basic shape and a second threshold of 255 corresponding to shapes other than the basic shape, are set is used. The adjustment coefficients are Ax0=Ay0=Az0=0, that is, a cycle of the three-dimensional threshold matrix Mt2 is not adjusted.

As illustrated in FIG. 15, the first attribute values V1 vary between 0 and 255 in such a way as to become larger on a right part in the X-axis direction. Since the cycle of the three-dimensional threshold matrix Mt2 is not adjusted here, the second attribute values V2 of voxels corresponding to two basic shapes simply arranged side-by-side in the X-axis direction indicate, as illustrated in FIG. 15, that a voxel is to be formed.

Figure 16:
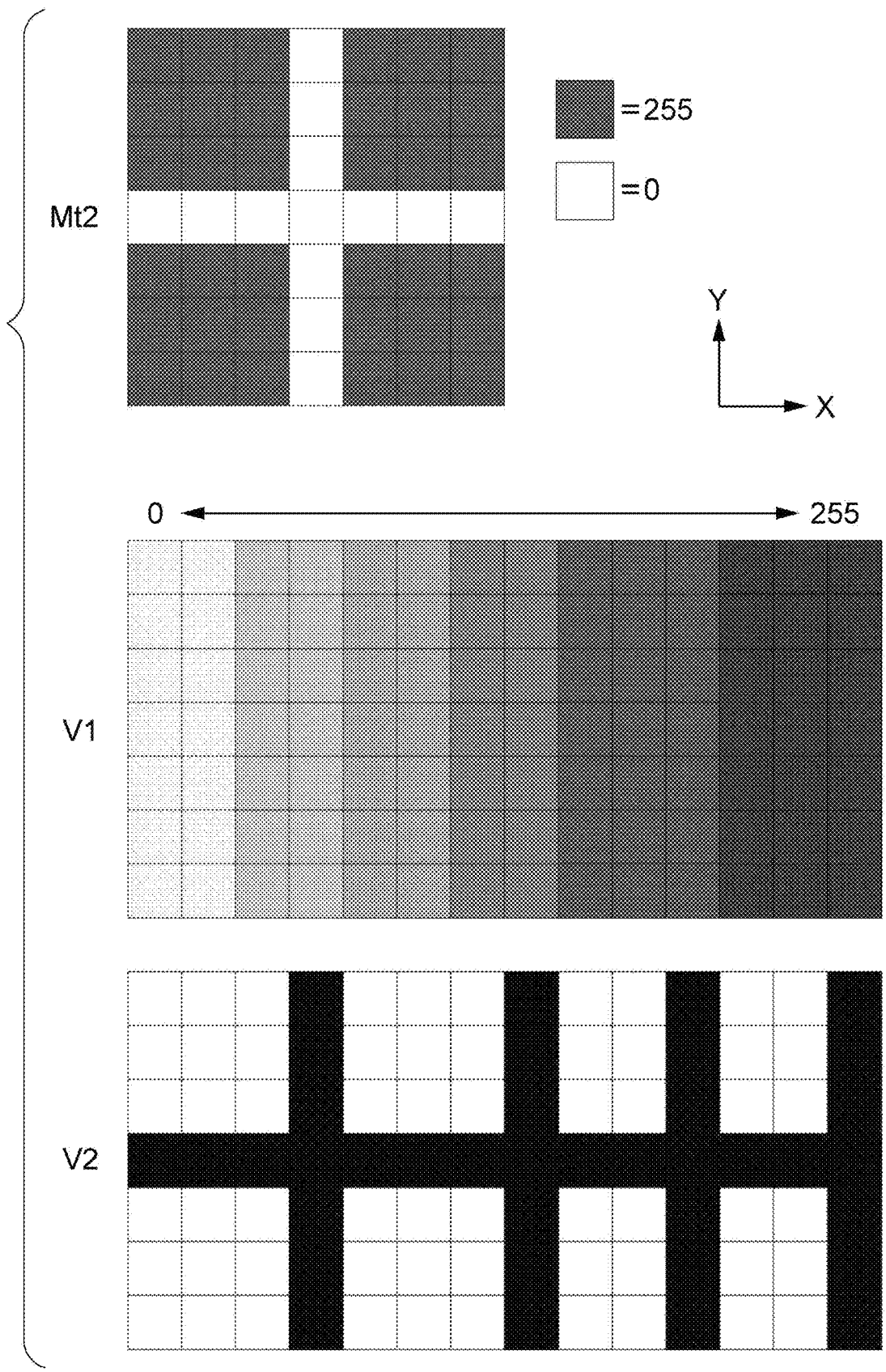
FIG. 16 is a diagram illustrating another example of the threshold matrix, the first attribute values, and the second attribute values.

If, in the example illustrated in FIG. 15, the adjustment coefficients become Ax0=Ay0=Az0=1, that is, the cycle of the three-dimensional threshold matrix Mt2 is adjusted, a coordinate scale of the three-dimensional threshold matrix Mt2 compared with the first attribute values V1 changes. As a result, as illustrated in FIG. 16, the second attribute values V2 of voxels corresponding to basic shapes that become denser in a right part in the X-axis direction indicate that a voxel is to be formed.

Figure 17:
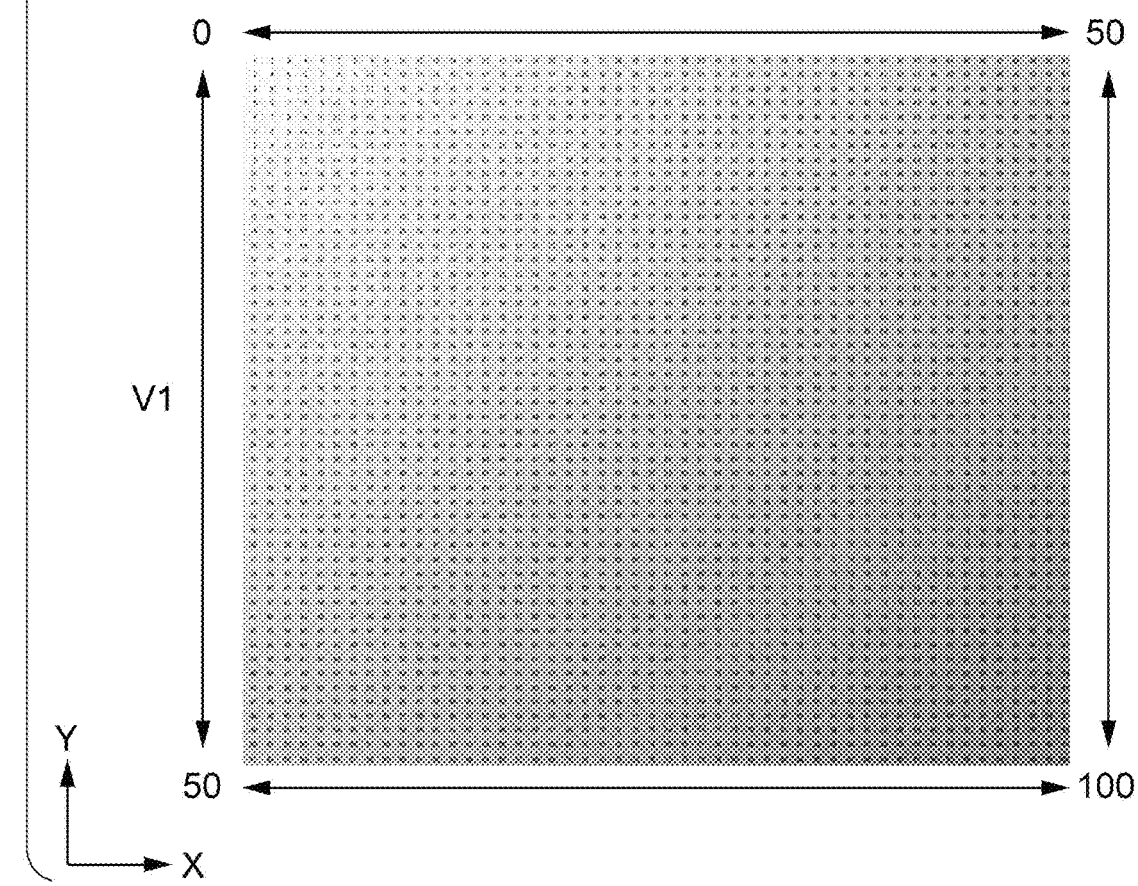
FIG. 17 is a diagram illustrating an example of the threshold matrix and the first attribute values.

Next, as illustrated in FIG. 17, a case will be described where a threshold matrix Mt3 in which two different thresholds, namely a first threshold of 0 corresponding to the basic shape and a second threshold of 100 corresponding to shapes other than the basic shape are set is used.

As illustrated in FIG. 17, the first attribute values V1 vary in such a way as to become larger in a lower right part of FIG. 17.

Figure 18:
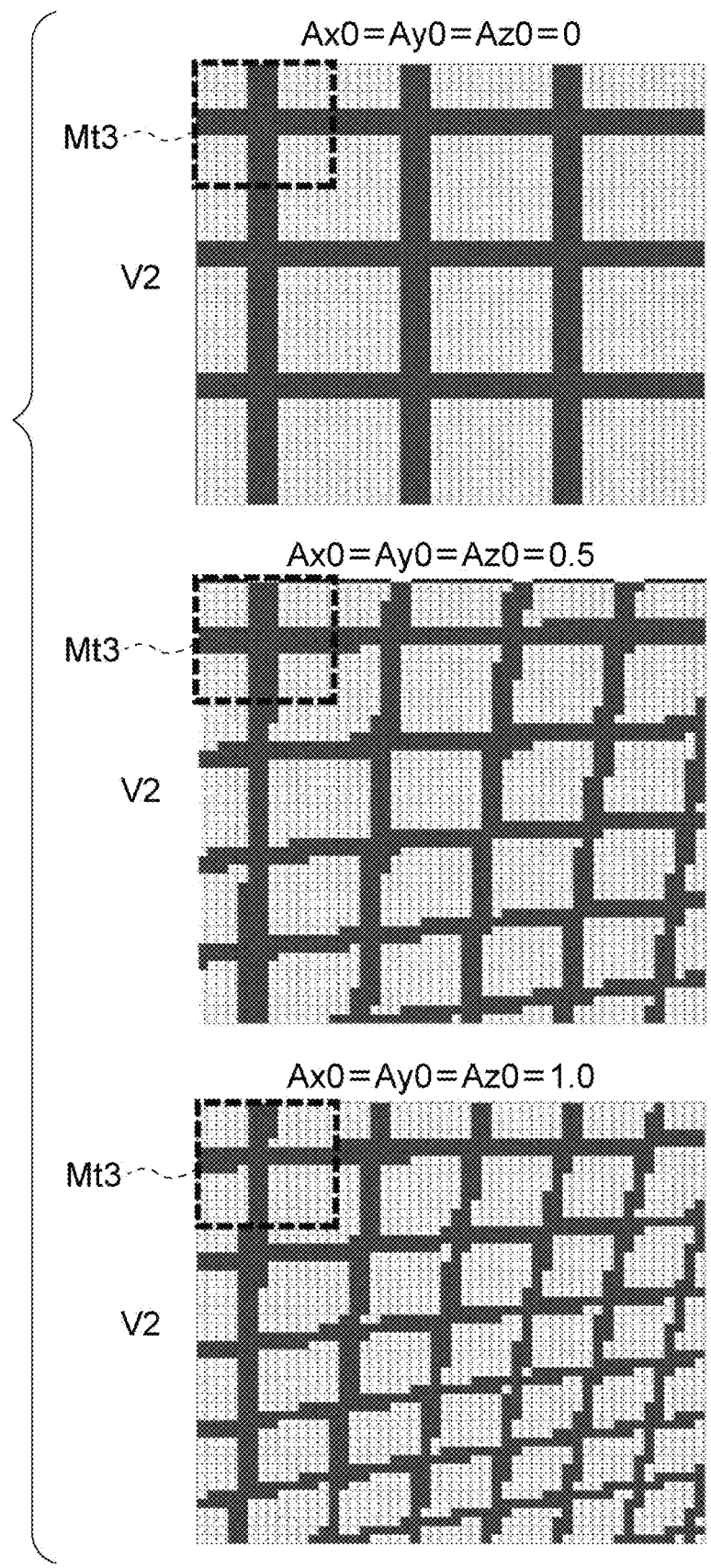
FIG. 18 is a diagram illustrating an example of the second attribute values.

FIG. 18 illustrates results of calculation of the second attribute values V2 based on the three-dimensional threshold matrix Mt3 illustrated in FIG. 17 and the first attribute values V1 at times when the adjustment coefficients are Ax0=Ay0=Az0=0, when the adjustment coefficients are Ax0=Ay0=Az0=0.5, and when the adjustment coefficients are Ax0=Ay0=Az0=1.0.

As illustrated in FIG. 18, a shape of a cross, which is the basic shape, becomes denser in the X-axis direction and the Y-axis direction as the adjustment coefficients become larger.

Figure 19:
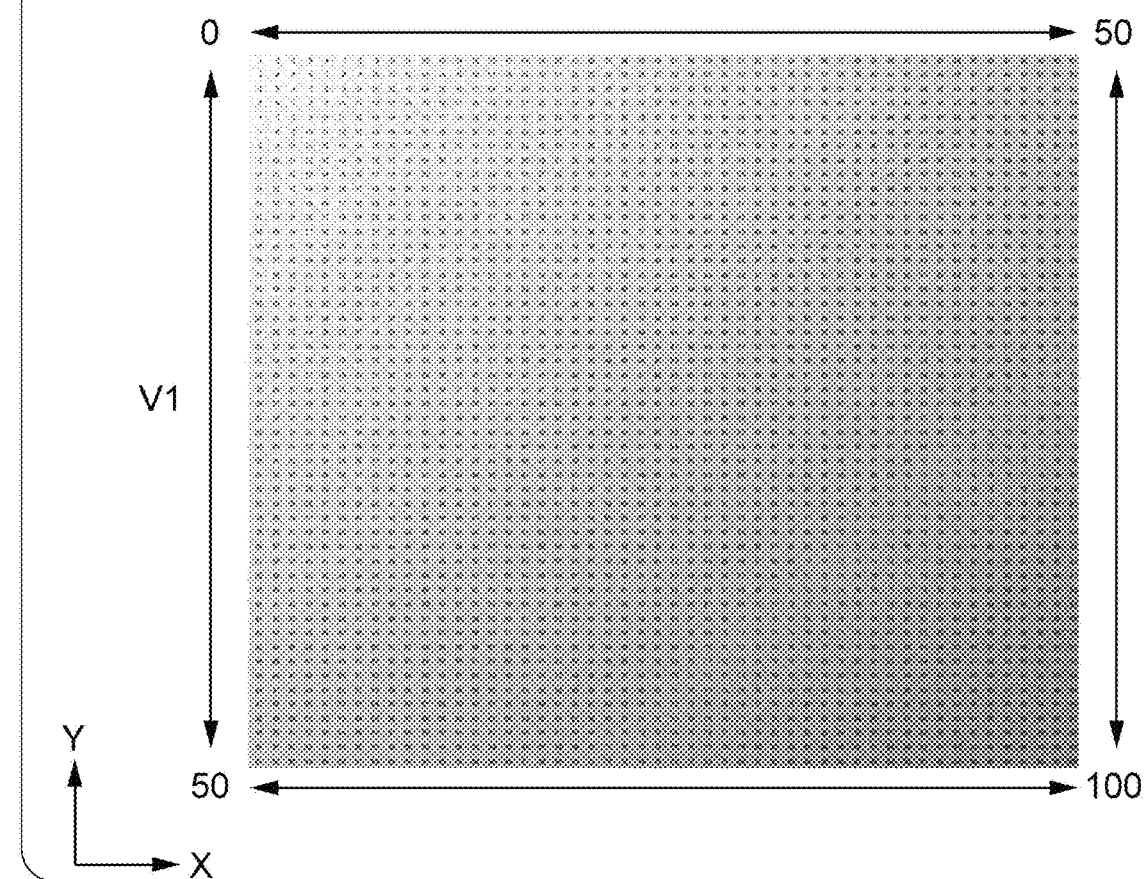
FIG. 19 is a diagram illustrating another example of the threshold matrix and the first thresholds.

Next, as illustrated in FIG. 19, a case will be described where various thresholds are set in a threshold matrix such that the thresholds gradually change from a threshold of 0, which corresponds to the basic shape. More specifically, a threshold matrix Mt4 includes nine different thresholds of 0, 15, 30, 40, 50, 70, 80, and 90. The larger the distance from the threshold of 0, which corresponds to the basic shape, the larger the threshold. The first attribute values V1 of voxels are the same as in FIG. 17.

Figure 20:
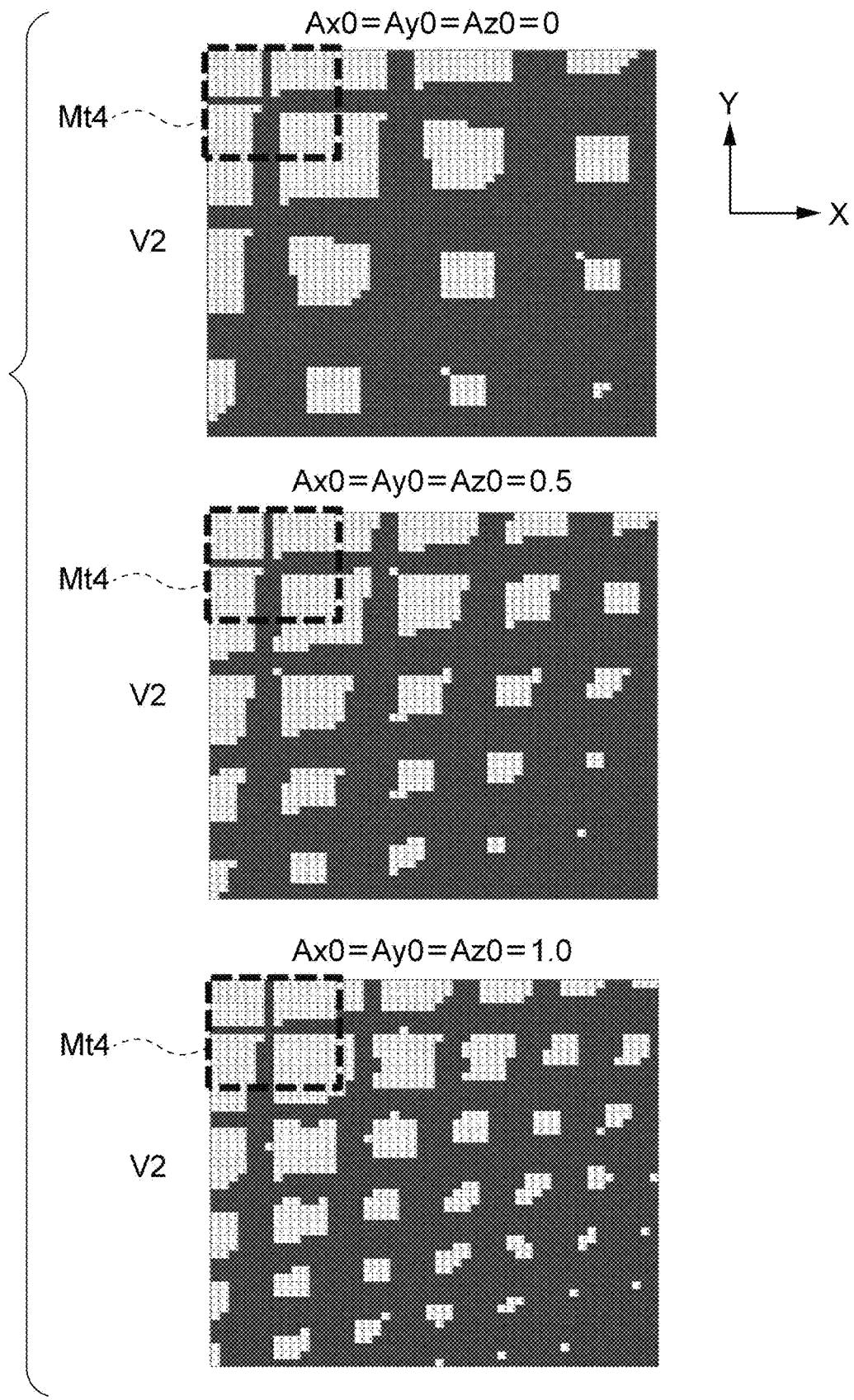
FIG. 20 is a diagram illustrating another example of the second attribute values.

FIG. 20 illustrates results of calculation of the second attribute values V2 based on the three-dimensional threshold matrix Mt4 illustrated in FIG. 19 and the first attribute values V1 at times when the adjustment coefficients are Ax0=Ay0=Az0=0, when the adjustment coefficients are Ax0=Ay0=Az0=0.5, and when the adjustment coefficients are Ax0=Ay0=Az0=1.0.

As illustrated in FIG. 20, a shape of a cross, which is the basic shape, becomes denser in the X-axis direction and the Y-axis direction as the adjustment coefficients become larger. Crosses are thicker than in FIG. 18.

By changing the adjustment coefficients and the threshold matrix, physical property values achieved by a three-dimensional object are finely adjusted.

In step S108, data indicating whether to form each voxel calculated in step S106 is transmitted to the three-dimensional object forming apparatus 100 as voxel data.

The obtaining unit 110 of the three-dimensional object forming apparatus 100 obtains the voxel data transmitted from the three-dimensional object data generation apparatus 10. The control unit 112 drives the discharge head driving unit 104 to move the discharge head 102 in two dimensions and control discharging of a forming material by the discharge head 102 such that the forming material is discharged in accordance with the voxel data obtained by the obtaining unit 110.

Although the present disclosure has been described using an exemplary embodiment, the present disclosure is not limited to the above exemplary embodiment. The exemplary embodiment may be modified or improved in various ways without deviating from the scope of the present disclosure. The technical scope of the present disclosure also includes such modifications and improvements.

Although an intensity value indicating the intensity of a voxel is set for the voxel as a first attribute value and whether to form the voxel is calculated as a second attribute value in the above exemplary embodiment, for example, types of first and second attribute values are not limited to these. For example, a level of conductivity may be set as a first attribute value, and whether there is conductivity may be calculated as a second attribute value, instead. In this case, a nonconductive material may be set for voxels whose levels of conductivity are equal to or higher than a threshold, and a conductive material may be set for voxels whose levels of conductivity are lower than the threshold.

Although a case where the second attribute values V2 are calculated using a single threshold matrix regardless of the first attribute value V1 in the above exemplary embodiment, a threshold matrix used may be switched in accordance with the first attribute value V1, instead. For example, if the first attribute value V1 is equal to or larger than a predetermined threshold TH, the second attribute value V2 may be calculated using the three-dimensional threshold matrix Mt1 illustrated in FIG. 13, and if the first attribute value V1 is smaller than the predetermined threshold TH, the second attribute value V2 may be calculated using the three-dimensional threshold matrix Mt2 illustrated in FIG. 15. Alternatively, two or more thresholds TH may be provided, and three or more threshold matrices may be used in accordance with the first attribute value V1.

Although the three-dimensional object data generation apparatus 10 and the three-dimensional object forming apparatus 100 that forms a three-dimensional object on the basis of three-dimensional object data are separately provided in the above exemplary embodiment, the three-dimensional object forming apparatus 100 may have the function of the three-dimensional object data generation apparatus 10, instead.

That is, the obtaining unit 110 of the three-dimensional object forming apparatus 100 may obtain voxel data, and the control unit 112 may generate three-dimensional object data by performing the generation process illustrated in FIG. 6.

Alternatively, for example, the process for generating three-dimensional object data illustrated in FIG. 6 may be achieved by hardware such as an application-specific integrated circuit (ASIC). In this case, processing speed increases compared to when the process is achieved by software.

Although the program for generating three-dimensional object data is installed on the storage unit 20 in the above exemplary embodiment, the process need not be installed on the storage unit 20. The program according to the above exemplary embodiment may be provided in a computer readable storage medium, instead. For example, the program in the present disclosure may be provided in an optical disc such as a compact disc read-only memory (CD-ROM) or a digital versatile disc read-only memory (DVD-ROM) or a semiconductor memory such as a universal serial bus (USB) memory or a memory card. Alternatively, the program according to the above exemplary embodiment may be obtained from an external apparatus through a communication line connected to the communication unit 18.

The foregoing description of the exemplary embodiment of the present disclosure has been provided for the purposes of illustration and description. It is not intended to be exhaustive or to limit the disclosure to the precise forms disclosed. Obviously, many modifications and variations will be apparent to practitioners skilled in the art. The embodiment was chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A three-dimensional object data generation apparatus comprising:
    an obtaining unit that obtains three-dimensional object data representing a three-dimensional object with a plurality of voxels, for each of which a first attribute value is set;
    a setting unit that sets a three-dimensional threshold matrix in which thresholds are arranged in a three-dimensional space;
    an adjustment unit that adjusts a cycle of the three-dimensional threshold matrix in accordance with the first attribute values; and
    a calculation unit that calculates, for each of the plurality of voxels, a second attribute value using the first attribute value of the voxel and the three-dimensional threshold matrix whose cycle has been adjusted by the adjustment unit,
    wherein the adjustment unit adjusts the cycle of the three-dimensional threshold matrix in accordance with an adjustment coefficient for setting a degree of adjustment of the cycle of the three-dimensional threshold matrix.

2. The three-dimensional object data generation apparatus according to claim 1,
    wherein the adjustment coefficient is set for each of three axes of the three-dimensional space perpendicular to one another.

3. The three-dimensional object data generation apparatus according to claim 1, further comprising:
    a reception unit that receives the adjustment coefficient.

4. The three-dimensional object data generation apparatus according to claim 1,
    wherein, in the three-dimensional threshold matrix, the thresholds are arranged in the three-dimensional space in accordance with a predetermined basic shape.

5. The three-dimensional object data generation apparatus according to claim 1,
    wherein the calculation unit switches the three-dimensional threshold matrix in accordance with the first attribute value.

6. A three-dimensional object forming apparatus comprising:
    a forming unit that forms a three-dimensional object on a basis of three-dimensional object data generated by the three-dimensional object data generation apparatus according to claim 1.

7. A non-transitory computer readable medium storing a program for generating three-dimensional object data, the program causing a computer to function as components of the three-dimensional object data generation apparatus according to claim 1.

8. A three-dimensional object data generation apparatus comprising:
    an obtaining unit that obtains three-dimensional object data representing a three-dimensional object with a plurality of voxels, for each of which a first attribute value is set;
    a setting unit that sets a three-dimensional threshold matrix in which thresholds are arranged in a three-dimensional space;
    an adjustment unit that adjusts a cycle of the three-dimensional threshold matrix in accordance with the first attribute values; and
    a calculation unit that calculates, for each of the plurality of voxels, a second attribute value using the first attribute value of the voxel and the three-dimensional threshold matrix whose cycle has been adjusted by the adjustment unit,
    wherein, in the three-dimensional threshold matrix, the thresholds are arranged in the three-dimensional space in accordance with a predetermined basic shape, and
    wherein the thresholds include two different thresholds, namely a first threshold corresponding to the basic shape and a second threshold corresponding to a shape other than the basic shape.

9. A three-dimensional object data generation apparatus comprising:
    an obtaining unit that obtains three-dimensional object data representing a three-dimensional object with a plurality of voxels, for each of which a first attribute value is set;
    a setting unit that sets a three-dimensional threshold matrix in which thresholds are arranged in a three-dimensional space;
    an adjustment unit that adjusts a cycle of the three-dimensional threshold matrix in accordance with the first attribute values; and
    a calculation unit that calculates, for each of the plurality of voxels, a second attribute value using the first attribute value of the voxel and the three-dimensional threshold matrix whose cycle has been adjusted by the adjustment unit,
    wherein, in the three-dimensional threshold matrix, the thresholds are arranged in the three-dimensional space in accordance with a predetermined basic shape, and
    wherein the thresholds include various thresholds such that the thresholds gradually change from a threshold corresponding to the predetermined basic shape.

* * * * *